United States Patent [19]

Nonaka et al.

[11] Patent Number: 4,807,011
[45] Date of Patent: Feb. 21, 1989

[54] SEMICONDUCTOR INTEGRATED CIRCUIT INCORPORATING SITS

[75] Inventors: Terumoto Nonaka; Tadahiko Hotta, both of Hamamatsu, Japan

[73] Assignee: Nippon Gakki Seizo Kabushiki Kaisha, Hamamatsu, Japan

[21] Appl. No.: 24,930

[22] Filed: Mar. 10, 1987

Related U.S. Application Data

[63] Continuation of Ser. No. 767,708, Apr. 25, 1985, abandoned, which is a continuation of Ser. No. 368,968, Apr. 16, 1982, abandoned.

[30] Foreign Application Priority Data

Apr. 21, 1981 [JP] Japan .................................. 56-60061

[51] Int. Cl.$^4$ ...................... H01L 29/68; H01L 27/04
[52] U.S. Cl. ...................................... 357/45; 357/13; 357/22
[58] Field of Search ...................... 357/13, 22, 41, 45, 357/92

[56] References Cited

U.S. PATENT DOCUMENTS

| | | | |
|---|---|---|---|
| 4,198,648 | 4/1980 | Nishizawa | 357/22 |
| 4,205,334 | 5/1980 | Nonaka et al. | 357/41 |
| 4,216,490 | 8/1980 | Ohki | 357/43 |
| 4,434,433 | 2/1984 | Nishizawa | 357/15 |

FOREIGN PATENT DOCUMENTS

| | | |
|---|---|---|
| 2819001 | 11/1978 | Fed. Rep. of Germany . |
| 2833068 | 8/1979 | Fed. Rep. of Germany . |
| 81/00489 | 2/1981 | PCT Int'l Appl. .......... 357/22 E |

OTHER PUBLICATIONS

Hart et al, "Bioplar LSI Takes a New Direction With Integrated Injection Logic" Electronics, Oct. 3, 1974, pp. 111-118.
Yamaguchi et al, "Optimum Design of Triode-Like JFET's by Two-Dimensional Computer Simulation", IEEE Transactions on Electron Devices, vol. ED-24 No. 8, Aug 1977, pp. 1061-1069.
Baliga, "A Power Junction Gate Field-Effect Transistor Structure With High Blocking Gain", Transactions on Electron Devices, vol. ED-27, No. 2, Feb. 1980 pp. 368-373.
Kondo et al, "A New Bioplar Transistor-GAT", IEEE Transactions on Electron Devices, vol. ED-27, No. 2, Feb. 1980, pp. 373-379.

*Primary Examiner*—William D. Larkins
*Attorney, Agent, or Firm*—Cushman, Darby & Cushman

[57] ABSTRACT

A semiconductor integrated circuit comprising a plurality of vertical static induction transistors (SITs) of normally-off type formed in a common semiconductor substrate in such a manner that the lateral dimension of the channel region of the SITs employed to form a hardware circuit region such as a logic circuit is designed greater than of the SITs which are employed to form a peripheral circuit region. Thus, it is possible to provide a semiconductor integrated circuit which concurrently satisfies a plurality of differently functioning semiconductor circuit requirements to exhibit different electric characteristics as represented by a high-speed operation and a high breakdown voltage.

2 Claims, 2 Drawing Sheets

SEMICONDUCTOR INTEGRATED CIRCUIT INCORPORATING SITS

This is a continuation of application Ser. No. 767,708, filed Apr. 25, 1985, which was abandoned upon the filing hereof and which was a continuation of Ser. No. 368,968, filed Apr. 16, 1982, now abandoned.

BACKGROUND OF THE INVENTION (a) Field of the Invention

The present invention concerns a semiconductor integrated circuit containing, on a common semiconductor substrate, at least one vertical static induction transistor and at least one vertical static induction type transistor wherein the former transistor is used to form a logic circuit region and the latter transistor, a peripheral circuit region such as an interface circuit, respectively, of a semiconductor integrated circuit to provide functions different from each other.

(b) Description of the Prior Art

Semiconductor integrated circuits are being used in various electronic devices and apparatuses. As is well known, these circuits are being advanced toward higher packing density and larger scale. Above all, the size and scale of electronic computers have, of late, been on the increase. Along with this, development is making rapid progress in the fabrication of such integrated circuits (IC), large scale integrated circuits (LSI) and very large scale integrated circuits (V-LSI) that are superior in high-speed operation and large capacity of their constituent logic circuits, controlling circuits and/or memory circuits. In the past, bipolar transistors have been well known in their employment in semiconductor integrated circuits for the purpose of providing high-speed operation. It has been difficult, however, in such known semiconductor integrated circuits, to design the logic circuit requirements of high-speed operation so as to be compatible with those requirements of the peripheral regions which are connected to the high-speed operation regions. For example, a digitalized LSI which is employed in, for example, an electronic computer is comprised of a circuit region such as a logic circuit region and a memory circuit region both of which require high-speed operation (such a circuit region will hereunder be referred to simply as a hardware region) and a peripheral circuit region including a so-called interface circuit region intended to operatively and functionally connect the hardware region to a desired device or devices. In case, for example, two bipolar transistors are used to form the two types of circuit regions mentioned above to constitute a semiconductor integrated circuit, the respective operating characteristics of these two bipolar transistors have been noted to conflict between the high-speed operation requirements and the good interface requirements. Therefore, in the designing of a semiconductor integrated circuit with bipolar transistors, aspects of either one of the two requirements has had to be sacrificed. More particularly, in order to satisfy the high-speed characteristic of the semiconductor integrated circuit exhibited by one of the constituent bipolar transistors, this specific bipolar transistor is required to have a narrow base width, since the frequency characteristic of a bipolar transistor depends mainly on the width of the base region thereof. Although a bipolar transistor having a narrow base width satisfies the high-speed operation of the hardware region, the peripheral region which is manufactured at the same time with the hardware region on the same principal surface of a semiconductor substrate will develop the so-called punch-through phenomenon due to the narrow base width of the bipolar transistor of the an interface circuit. Thus, the breakdown voltage is lowered, and the bipolar transistor constituting the hardware region will become broken. The breakdown voltage of the hardware region may well be low, since the operating voltage applied is usually low. Since, however, the operation voltage used for the peripheral circuit region is high, there is required a high breakdown voltage for that particular bipolar transistor constituting the peripheral circuit region.

For the reasons stated above, it will be noted that, in case a semiconductor integrated circuit is fabricated on a common semiconductor substrate by integrating the hardware circuit region and peripheral circuit region, there is the necessity to design so that the peripheral region has a breakdown voltage higher than the operating voltage, as a result of which the high-speed characteristic of the hardware region will not be satisfied sufficiently. In such semiconductor devices as, for example, STL (Schottky Transistor Logic), ISL (Integrated Schottky Logic) and IIL (Integrated Injection Logic) which are all known typical semiconductor integrated circuits serving as logic circuits, there is ordinarily used a power supply having a voltage of about 1-2 V for operating the logic circuit of the hardware region. In contrast thereto, the power supply for the interface circuit in the peripheral circuit region is set to have a voltage of about 5 V to operate such interface circuits. Accordingly, in order to design so that the peripheral region has a breakdown voltage of about 5 V, the bipolar transistor which serves as an interface circuit region requires to have a breakdown voltage of 6-7 V. Accordingly, the high-speed operation of the other bipolar transistor provided in the logic circuit region which is formed at the same time with the interface bipolar transistor can no longer be expected to exert a sufficiently speedy operation.

In order to resolve this problem of semiconductor integrated circuits encountered in the past, there may be considered the fabrication of said hardware circuit region and said peripheral circuit region in separate steps relative to each other. Such manner of manufacture of a semiconductor integrated circuit, however, contributes only to complication of the process, leading to a reduction in the production yield and an increase in the manufacturing cost. This is especially so in the case of manufacture of bipolar transistors. A bipolar transistor is formed by relying on the planar technique. That is, its base width is determined by two selective diffusion steps which are called "base diffusion" and "emitter diffusion". Thus, the complication of the overall fabricating process will become all the more prominent.

SUMMARY OF THE INVENTION

It is, therefore, the object of the present invention to eliminate the drawbacks of the conventional semiconductor integrated circuit, and to provide a semiconductor integrated circuit whose hardware circuit region maintains a high-speed function and yet which concurrently satisfies the required breakdown characteristic of the peripheral circuit region such as the interface circuit, and which allows easy manufacture without requiring a complicated fabricating process.

DETAILED DESCRIPTION OF THE PREFERRED EMBODIMENT

The semiconductor integrated circuit according to the present invention features the use of a plurality of vertical SITs formed in a principal surface of a semiconductor substrate, and also the arrangement of these SITs such that the lateral dimension of the channels thereof, i.e. the channel widths, of these SITs are different relative to each other.

Figure 1:
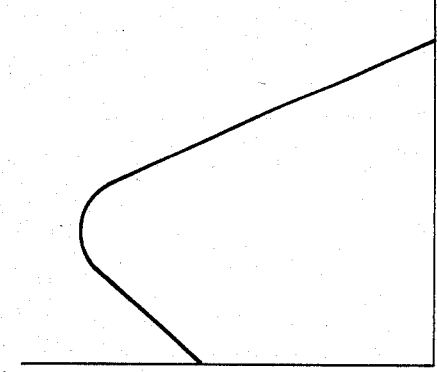
FIG. 1 is an explanatory illustration of a fundamental structure of a static induction transistor.
Figure 2:
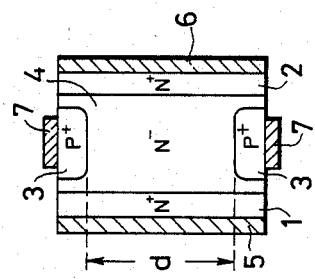
FIG. 2 is a chart showing an electric potential distribution from source region to drain region in the channel region when a potential barrier is formed therein.

Prior to describing the contents and embodiment of the present invention, a brief explanation of a static induction transistor (SIT) will be made for a better understanding of the present invention. The fundamental structure of a junction type SIT is shown in FIG. 1. This fundamental structure thereof has a resemblance to that which is called a "field effect transistor" (FET). A SIT is comprised of an $n^+$ type semiconductor source region 1, an $n^+$ type semiconductor drain region 2, a $p^+$ type semiconductor gate region 3 and an $n^-$ type semiconductor channel region 4. Regions 5, 6 and 7 represent ohmic contact electrodes for the source, drain and gate regions, respectively. What differs from an FET are the sizes and impurity concentrations of the respective constituting semiconductor regions. In particular, the impurity concentration of the $n^-$ type channel region 4 is set significantly lower than that of the FET. This SIT is operative so that, even when a reverse bias voltage which is applied across the $n^+$ type source region 1 and the $p^+$ type gate region 3 is small, and even when a depletion layer is developed only by the built-in potential produced due to the junction, depending on cases, the $n^-$ type channel region 4 becomes depleted of carriers and presents the so-called space charge region. The channel width d may be named in the same way as in the case of an FET. However, it is not appropriate to apply to the SIT the concept of "channel length" which influences the I-V characteristic of an FET. As described above, in a SIT, the potential in the channel region, i.e. the space charge region, is controlled by a bias voltage which is applied to the gate region, whereby the amount of the carriers which flow from the source region into the drain region is controlled. Accordingly, by rendering the channel region a high resistivity region either through narrowing the channel width or through setting the impurity concentration of the channel region at a low level, or by intensifying the magnitude of the reverse bias voltage which is applied to the gate region, the channel region will become completely depleted to present a space charge region. Thus, the potential distribution in that portion of the channel region from the source region to the drain region will become as shown in FIG. 2. Whereby, the flow of carriers from the source region to the drain region is blocked by the potential barrier which is formed in the channel region. Such a potential distribution can be varied by virtue of the static induction effect induced by that voltage which is applied to the gate region and/or the drain region as the case may be. The I-V characteristic of such a SIT features is in general, a triode tube-like characteristic, i.e. unsaturated current characteristic. However, because the channel length (the length of that portion of the channel region located below the gate electrode) is short; the channel potential can be controlled by virtue of the static induction effect; the dimensions of the gate electrodes and so forth can be substantially reduced; and that, owing to the low impurity concentration of the channel region, the junction capacitance can be set low, this SIT has very superior abilities, such as, in high power characteristics, high-speed operation (i.e. high frequency characteristic) and in low energy operation, low noise characteristic, and miniaturization of the device concerned. It should be understood that in FIG. 1, a junction type n-channel SIT structure in shown but it is possible to manufacture a SIT of MOS gate type, and also of a p-channel type as well.

It will be noted here that the potential distribution shown in FIG. 2 applies not only to an SIT, but also to the state of a bipolar transistor in which its base region has punched through. Thus, the semiconductor device which is called SIT is one which may be considered to be at an extreme state of a bipolar transistor whose base width is very thin so as to be very close to the punching-through condition.

As such, in the $n^-$ type channel region in the location the source region and the drain region shown in FIG. 1, there is inserted a p type layer by taking into consideration such factors as impurity concentration and thickness of the layer, so that this p type layer which corresponds to the base region of a bipolar transistor has punched through, presenting a space charge region. A device which thus resembles a bipolar transistor structure may be regarded as a family of SIT.

Also, the reason why the word "vertical" is applied to an SIT is that, in case the SIT shown in FIG. 1 is incorporated in an semiconductor integrated circuit, the direction of the carrier flow from the source region to the drain region is vertical relative to the principal horizontal surface of the semiconductor substrate. This vertical direction of carrier flow, however, has nothing to do with the characteristics of an SIT.

The present invention will hereinafter be explained with respect to a preferred embodiment of thereof.

Figure 3:
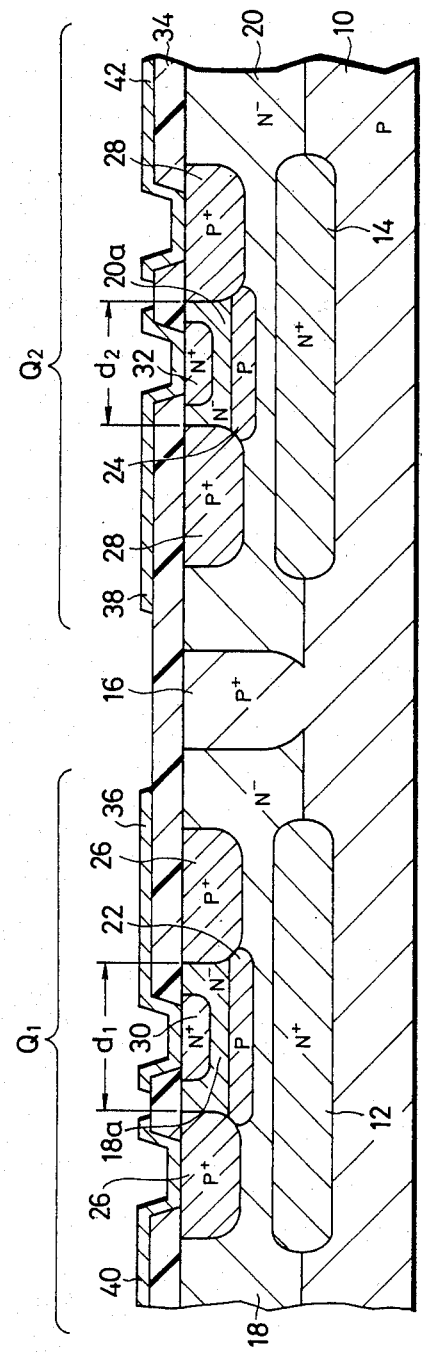
FIG. 3 is a diagrammatic sectional view of a semiconductor integrated circuit embodying the present invention.

FIG. 3 shows a schematic sectional view of a semiconductor integrated circuit embodying the present invention. Symbol $Q_1$ represents a vertical SIT which is employed in the formation of a hardware circuit region such as logic circuit described above. Symbol $Q_2$ illustrates a vertical SIT which is used to form a peripheral circuit region such as an interface circuit. The fundamental difference between the vertical SITs $Q_1$ and $Q_2$ is found in the lateral dimensions of the channel regions, i.e. the channel widths, of these SITs. That is, the lateral dimension $d_1$ of the channel region of the SIT $Q_1$ is designed to be greater than that of the SIT $Q_2$, i.e. $d_1 > d_2$.

Hereunder, explanation will be made of the structure, the impurity concentration of the respective regions and the fabricating process of these SITs. On top of a semiconductor substrate 10 which is made of, for example, a p type silicon, are formed, by relying on, for example, the known selective diffusion technique, $n^{30}$ type buried layers 12 and 14 whose impurity concentrations are in the range of about $1 \times 10^{24} - 1 \times 10^{26}/m^3$. Thereafter, by relying on the known epitaxial growth technique, an $n^-$ type layer 20 having an impurity concentration of about $1 \times 10^{19} - 1 \times 10^{21}/m^3$ and a thickness of about 1-3 micrometers is formed on top of the remaining portions of the p type substrate 10. Then, by relying on, for example, the known selective diffusion technique, there is formed a $p^+$ type isolation region 16 in said $n^-$ type layer 20 to form two electrically separated $n^-$ type regions 18 and 20 in the form of two islands. It should be noted, however, that this $p^+$ type isolation region 16 may be obtained by an isolation structure by virtue of a wedge-shaped groove, i.e. which is called air isolation though not shown, in place of depending on such selective diffusion technique as shown in FIG. 3. Also, said groove may be provided with a dielectric made of $SiO_2$ or with polysilicon crystal.

In the embodiment of FIG. 3, it will be noted that, in the $n^-$ type regions 18 and 20, there are formed p type high-resistivity regions 22 and 24 in order to make easy the phenomenon to appear that a depletion layer grows in the width direction of the channel region so that the channel will easily exhibit the pinch-off condition. The p type high-resistivity regions 22 and 24 can be formed by implanting a p type impurity by relying on the known ion implantation technique. By controlling the amount of the dose of the impurity which is to be implanted, it is possible to set the impurity concentration of the p type region at about $1 \times 10^{17} - 1 \times 10^{19}/m^3$. It should be understood that these highly resistive regions 22 and 24 may be omitted depending on case.

In the $n^-$ type regions 18 and 20, there are formed concurrently, by relying on the known selective diffusion technique, $p^+$ type gate regions 26 and 28 having an impurity concentration of about $1 \times 10^{24} - 1 \times 10^{27}/m^3$ and a junction depth of about 0.5-3 micrometers due to diffusion, in such way as to sandwich the regions 18a and 20a which will serve as the channel regions, or to surround these channel regions 18a and 20a, depending on case. It should be understood that, in case it is intended to provide the abovesaid p type high resistivity regions 22 and 24, these regions are designed to contact said $p^+$ type gate regions 26 and 28, respectively.

In the embodiment stated above, the lateral dimension $d_1$ of the channel region 18a which is the dimension in parallel with the surface of the substrate is set to be greater than the similar dimension $d_2$ of the channel region 20a. In order to achieve such difference in the lateral dimensions of the channel regions of the respective SITs, it is only necessary to alter the masking dimensions at the time of designing the masks for the selective diffusion of impurity at the time the $p^{30}$ type gate regions 26 and 28 are formed concurrently. This is easy for the fabrication process. However, depending on cases, the diffusion depths of the $p^+$ type gate regions 26 and 28 may be changed relative to each other to thereby alter the dimension $d_1$ from the dimension $d_2$. Thanks to the provision of a difference in the lateral dimensions of the channel regions of the two SITs, it is possible to achieve, concurrently, a high-speed operation of the SIT $Q_1$ and a high breakdown voltage of the SIT $Q_2$.

It should be understood that the $p^+$ type gate regions 26 and 28 may be formed in such way that they are in contact with their corresponding buried regions 12 and 14, respectively, so as to reduce the junction capacitances.

On the surfaces of the channel regions 18a and 20a, there are formed simultaneously $n^+$ type source regions 30 and 32 having an impurity concentration of $1 \times 10^{24} - 1 \times 10^{27}/m^3$ and a depth of about 0.2-0.5 micrometers, respectively, by relying on the known selective diffusion technique. The direction of flow of carriers from the source region to the drain region in each SIT is substantially vertical relative to the surface of the substrate. Thus, these SITs each acquires a vertical structure as stated above already. Through an insulator film 34 which is made of, for example, $SiO_2$ and which covers the surface of the substrate are formed windows selectively, for obtaining an ohmic contact of a metal electrode. In this way, there are provided, in ohmic contact, source electrodes 36 and 38 for their corresponding source regions 30 and 32, and gate electrodes 40 and 42 for their corresponding gate regions 26 and 28, respectively.

Now, in such embodiment of integrated circuit device as shown in FIG. 3, SITs $Q_1$ and $Q_2$ are designed so that, even in the absence of a reverse bias voltage applied to the gate regions, a depletion layer extends to provide a pinched-off state, i.e. they are each designed so that even at zero bias voltage, such potential barrier as will inhibit the flow of carriers from the source region to the drain region is formed in the channel region. This is because of the fact that, in each of the high-resistivity regions 22 and 24 of these two SITs, a depletion layer tends to grow easily, and that owing to the presence of this depletion layer, there is completely formed a space charge region in the channel region in the breadthwise direction thereof. These two SITs, however, are each designed so that, even when these high-resistivity regions 22 and 24 are omitted, the channel region will become pinched off by the depletion layer extending from the gate regions 26 and 28 even in case there is no voltage applied to the gate regions. By so designing these SITs $Q_1$ and $Q_2$, they are indeed the so-called normally-off type SITs wherein no drain current will flow when no voltage is applied to the gate regions. In order to cause a current to flow through these SITs, the height of the potential barrier shown in FIG. 2 is controlled by an applied gate voltage. More particularly, in these SITs of this embodiment, the height of the potential barrier is lowered by an application of a forward bias voltage, so that it becomes possible to render the SITs $Q_1$ and $Q_2$ conductive, i.e. it is possible to bring these SITs into the state wherein a current is able to flow.

Here, what is important is the fact that the channel width $d_1$ of the SIT $Q_1$ is designed to be greater than the channel width $d_2$ of the SIT $Q_2$, so that the height of the potential barrier of the SIT $Q_1$ is low, naturally, at zero gate bias, and that accordingly the SIT $Q_1$ is turned "on" easily by an application of a forward gate voltage which is lower than that applied to the SIT $Q_2$, and also that the speed of this turning "on" of $Q_1$ is greater than that of $Q_2$. In other words, the SIT $Q_1$ is a transistor which is able to perform a logic operation at a higher speed and at a lower voltage than for the other SIT $Q_2$.

Hereinunder will be briefly described the other SIT $Q_2$. As stated above, the height of the potential barrier in its channel region depends on such factors as the channel width, the impurity concentration of this channel region and a bias voltage which is applied to the gate, and this height of the barrier is lowered with an increase in the drain bias voltage applied. Accordingly, the greater the height of the potential barrier is, the greater will become the difficulty to cause variation, by virtue of the static induction effect, of the potential located close to the source region, i.e. it becomes more difficult to lower the potential height formed in the channel region.

Figure 4:
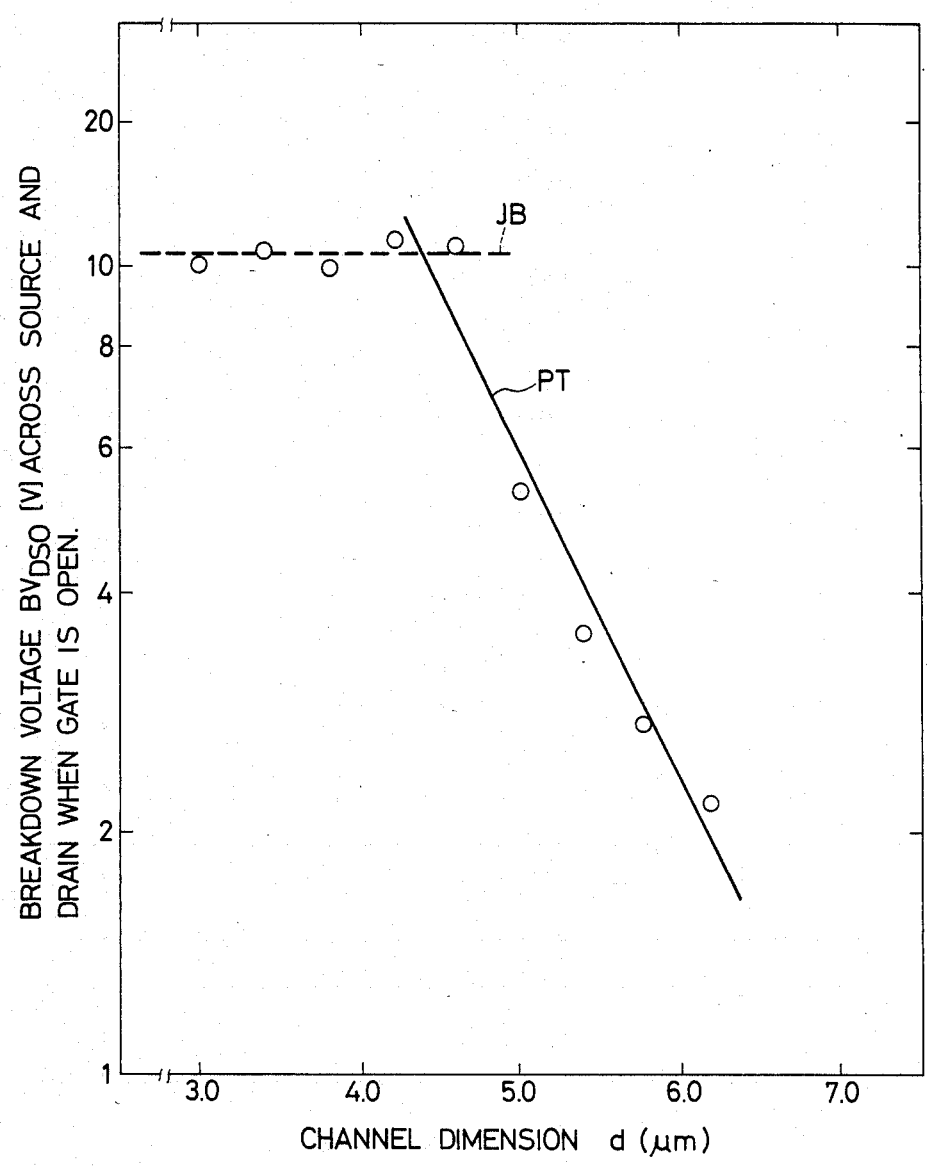
FIG. 4 is a chart showing the relationship between the channel width and the breakdown voltage applied across source region and drain region of a static induction transistor.

Accordingly, the breakdown voltage $BV_{DSO}$ across the source region and drain region when the gate electrode is open depends on the lateral dimension, i.e. width, d of the channel region, and these two, i.e. $BV_{DSO}$ and d, have such relationship as shown in FIG. 4. More specifically, in case the channel width d is relatively small, the breakdown voltage $BV_{DSO}$ will be determined by the breakdown voltage JB of the gate junction. As the channel width d becomes greater, the effect of static induction toward that portion of the channel region located close to the source side will become larger. In other words, the degree of a punching-through condition will become intensified, and thus the breakdown voltage will become lowered in accordance with the voltage PT which, in turn, depends on the intensified degree of the punch-through condition. As will be understood from the above, the breakdown voltage of the SIT $Q_2$ which is used to form a peripheral circuit region can be set greater than that of the SIT $Q_1$ which is employed in the hardware circuit region.

As stated above, by the formation, in a principal surface of a semiconductor substrate, of a plurality of vertical SITs having different lateral dimensions of their channel regions, and by arranging the lateral dimension of the channel region of that vertical SIT which is employed in the hardware circuit region to be greater than that of the other SIT to thereby satisfy the "high-speed operation and low voltage operation" requirements of the hardware circuit region, and by arranging the lateral dimension of the channel region of the vertical SIT which is employed in the peripheral circuit region to be narrower as compared with that of the SIT of the abovesaid hardware circuit region, it becomes possible to improve the breakdown voltage characteristic of the resulting integrated circuit.

It should be understood that, in the embodiment shown in FIG. 3, the SITs $Q_1$ and $Q_2$ which are provided with the p type high-resistivity regions 22 and 24 are regarded, structurally, as being equivalent to bipolar transistors whose base regions have disappeared by virtue of the punch-through phenomenon. Therefore, the term SIT in the present invention should be understood to cover such punch-through bipolar transistors.

Description has been made above with respect to the embodiment wherein normally-off type SITs are used. A junction type gate region has been shown in FIGS. 1 and 3. It should be understood that, as the manner of gate formation, there may be employed an insulated gate structure as is represented by, for example, a MOS structure, or the gate may be of the Schottky junction type. It should be understood further that the conductivity types of the respective semiconductor regions shown in FIGS. 1 and 3 may be reversed entirely. Still further, in the integrated circuit shown in FIG. 3, the device may be such that the position of the source region and the position of the drain region are inverted relative to each other to provide an upside-down type device.

As regards the I-V characteristic of an SIT which is used in the present invention, it exhibits a saturating characteristic.

As discussed above, according to the present invention, it should be understood that, by controlling the design of the SITs so that the lateral dimension of the channel region of each of a plurality of vertical SITs which are incorporated in a semiconductor integrated circuit, it is possible to integrate, in a principal surface of a semiconductor substrate, those circuit regions whose electric characteristics which are required are different relative to each other and in such fashion that the respective electric characteristics of the plurality of SITs are exhibited satisfactorily. Not only that, at the time such integrated circuit is fabricated, it is only necessary to somewhat change the dimensions of the masking windows which are used in carrying out the intended selective diffusion technique to achieve the above-mentioned features of the integrated circuit of the present invention. Thus, the process of fabrication of the integrated circuit according to the present invention is not complicated, and the manufacture thereof is easy and simple in spite of the inclusion of transistors of different channel dimensions. The abovesaid object of the present invention may be attained also by arranging a semiconductor integrated circuit in such manner that the hardware circuit region wherein a high-speed operation at a low breakdown voltage is required is formed with an ordinary bipolar transistor which does not punch through and its base region is retained, and, on the other hand, the peripheral circuit region which is required to have a considerably higher breakdown voltage is formed with a vertical SIT whose lateral dimension of channel region is so designed as to be able to obtain a higher breakdown voltage than that of said ordinary bipolar transistor. However, in view of the fabrication of a semiconductor integrated circuit by so designing that there is obtained a normally-off type SIT which, though its structure is similar to that of a bipolar transistor as shown in FIG. 3, is in a punched-through condition with a resulting loss of the base region, thereby developing the so-called bipolar-mode operation. This means the use of the transistor in such a way that the voltage applied across the source and the gate is forwardly biased in a similar way as across the emitter and the base of a bipolar transistor. It will be noted that the abovesaid arrangement of SITs, when compared with the instance wherein an ordinary bipolar transistor is employed, will exhibit many advantages as represented by, for example, a much higher speed of operation which means an improved frequency characteristic, as well as a lower energy operation which means a low dissipation of power, a low noise characteristic, and a high packing density.

What is claimed is:

1. A semiconductor device having an integrated circuit which respectively provides high speed internal logic operations and high-voltage peripheral circuit control operations, said integrated circuit being formed in a series of process steps and comprising:

a semiconductor substrate including an internal logic region and a peripheral circuit control region formed in substantially the same process step for respectively providing said internal logic and peripheral circuit control operations; and at least two vertical transistors formed in said substrate, each transistor having main current contact regions of a first conductivity type comprising source and drain regions which are separated by a lightly doped semiconductor channel region, the lightly doped semiconductor channel region being surrounded by a region of a second conductivity type and having a doping concentration sufficiently small as to be fully depleted in the absence of a bias voltage applied thereto by the built-in voltages due to the regions of the first conductivity type and the second conductivity type, at least a first one of said transistors having a larger lateral width for its channel region thereby to permit high-speed operation and lower power dissipation at low drive voltage for said internal logic operations, and at least another one of said transistors having a relatively smaller lateral width for its channel region to thereby have a higher breakdown voltage for said peripheral circuit control operations.

2. A semiconductor integrated circuit according to claim 1, in which:

a part of said channel region of at least one of said vertical transistors is formed with a semiconductor region having a conductivity type which is opposite to that of semiconductor regions used to form said source region and said drain region thereby facilitating channel pinching-off of said one transistor.

* * * * *